(12) United States Patent
Singh et al.

(10) Patent No.: US 10,115,719 B2
(45) Date of Patent: Oct. 30, 2018

(54) INTEGRATED CIRCUITS WITH RESISTOR STRUCTURES FORMED FROM MIM CAPACITOR MATERIAL AND METHODS FOR FABRICATING SAME

(71) Applicant: GLOBALFOUNDRIES, Inc., Grand Cayman (KY)

(72) Inventors: Jagar Singh, Clifton Park, NY (US); Sanford Chu, Poughkeepsie, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 248 days.

(21) Appl. No.: 14/928,272

(22) Filed: Oct. 30, 2015

(65) Prior Publication Data

US 2016/0126239 A1    May 5, 2016

Related U.S. Application Data

(60) Provisional application No. 62/072,785, filed on Oct. 30, 2014.

(51) Int. Cl.
*H01L 23/552*   (2006.01)
*H01L 27/06*   (2006.01)
*H01L 49/02*   (2006.01)

(52) U.S. Cl.
CPC ........ *H01L 27/0682* (2013.01); *H01L 23/552* (2013.01); *H01L 28/20* (2013.01); *H01L 28/40* (2013.01); *H01L 2924/0002* (2013.01)

(58) Field of Classification Search
CPC ... H01L 23/552; H01L 27/0682; H01L 28/20; H01L 28/40
See application file for complete search history.

(56) References Cited

U.S. PATENT DOCUMENTS

| | | | | |
|---|---|---|---|---|
| 6,083,785 | A | * | 7/2000 | Segawa ............... H01L 27/0629 257/E21.008 |
| 6,534,374 | B2 | | 3/2003 | Johnson |
| 7,154,158 | B2 | | 12/2006 | Kikuta et al. |
| 8,729,679 | B1 | * | 5/2014 | Phua .................... H01L 23/481 257/659 |
| 8,754,501 | B2 | | 6/2014 | Khan et al. |
| 2002/0040967 | A1 | * | 4/2002 | Oda ......................... G01J 5/08 250/338.1 |
| 2005/0082639 | A1 | * | 4/2005 | Kikuta ............... H01L 27/0629 257/533 |
| 2005/0272216 | A1 | * | 12/2005 | Remmel ............ H01L 23/5223 438/381 |
| 2006/0145296 | A1 | * | 7/2006 | Coolbaugh ............. H01L 28/20 257/536 |

(Continued)

*Primary Examiner* — Joseph Galvin, III
(74) *Attorney, Agent, or Firm* — Lorenz & Kopf, LLP

(57) ABSTRACT

Integrated circuits having resistor structures formed from a MIM capacitor material and methods for fabricating such integrated circuits are provided. In an embodiment, a method for fabricating an integrated circuit includes providing a semiconductor substrate with a resistor area and a capacitor area. The method includes depositing a capacitor material over the resistor area and the capacitor area of the semiconductor substrate. The method also includes forming a resistor structure from the capacitor material in the resistor area. Further, the method includes forming electrical connections to the resistor structure in the resistor area.

17 Claims, 9 Drawing Sheets

(56) References Cited

U.S. PATENT DOCUMENTS

| | | | |
|---|---|---|---|
| 2007/0108492 A1* | 5/2007 | Shibata | H01L 28/40 257/303 |
| 2010/0073122 A1* | 3/2010 | Le Neel | H01C 17/265 338/25 |
| 2011/0156205 A1* | 6/2011 | Maki | H01L 23/5223 257/531 |
| 2014/0231960 A1 | 8/2014 | Kim et al. | |

* cited by examiner

INTEGRATED CIRCUITS WITH RESISTOR STRUCTURES FORMED FROM MIM CAPACITOR MATERIAL AND METHODS FOR FABRICATING SAME

CROSS-REFERENCE TO RELATED APPLICATIONS

This application claims the benefit of U.S. Provisional Application No. 62/072,785, filed Oct. 30, 2014.

TECHNICAL FIELD

The present disclosure generally relates to integrated circuits having resistor structures and methods for fabricating such integrated circuits, and more particularly relates to integrated circuits having resistor structures formed from metal-insulator-metal (MIM) capacitor material and to methods for fabricating such integrated circuits.

BACKGROUND

Metal-insulator-metal (MIM) capacitors are valuable components in memory, logic and analog circuits. For example, MIM capacitors are critical in several mixed signal integrated circuits such as analog frequency tuning circuits, switched capacitor circuits, filters, resonators, up-conversion and down-conversion mixers, and A/D converters.

A typical MIM capacitor includes a first conductive layer, an insulating layer formed over the first conductive layer, and a second conductive layer formed over the insulating layer. As constructed, a MIM capacitor can store an electrical charge, with the charge per applied voltage (capacitance) of the capacitor dependent on the dielectric constant of the insulating layer, the thickness of the insulating layer (i.e., distance between the faces of the conductive layers), and the area of the conductive layers.

Typically integrated circuits also include resistors. Conventional resistors include doped polycrystalline silicon (polysilicon) resistive elements patterned to form a desired geometry. Contacts are formed at opposite ends of each doped polysilicon resistive element, such as from patterned silicide patches. The contacts define a conductive path to the doped polysilicon resistive elements and facilitate integration of the resistor with other semiconductor structures.

Resistors trued from doped polysilicon resistive elements typically suffer from high variability in resistance. For example, the resistance of resistors formed from doped polysilicon resistive elements may vary because of non-uniform hydrogen penetration into the polysilicon. Further, the resistance may vary due to the non-uniformity of doping processes. The resistance variability of resistors is a key concern in analog and digital circuit design.

Resistors formed from metal typically exhibit more precisely defined resistance. However, use of metal resistors in integrated circuits increases processing steps. Specifically, the formation of metal resistors typically requires additional mask deposition, patterning, and removal processes. As a result, overall integrated circuit fabrication processing cost is increased.

Accordingly, it is desirable to provide integrated circuits and methods for fabricating integrated circuits having resistor structures with more precisely defined resistance. Also, it is desirable to provide integrated circuits and methods for fabricating integrated circuits with resistor structures formed from a material other than polysilicon, e.g., MIM capacitor material. Further, it is desirable to provide methods for fabricating integrated circuits with resistor structures using no additional masking processes. Furthermore, other desirable features and characteristics will become apparent from the subsequent detailed description and the appended claims, taken in conjunction with the accompanying drawings and the foregoing technical field and background.

BRIEF SUMMARY

Integrated circuits having resistor structures formed from MIM capacitor material and methods for fabricating such integrated circuits are provided. In accordance with one embodiment, a method for fabricating an integrated circuit includes providing a semiconductor substrate with a resistor area and a capacitor area. The method includes depositing a capacitor material over the resistor area and the capacitor area of the semiconductor substrate. The method also includes forming a resistor structure from the capacitor material in the resistor area. Further, the method includes forming electrical connections to the resistor structure in the resistor area.

In another embodiment, a method for fabricating an integrated circuit includes depositing a dielectric layer overlying a resistor area and a capacitor area of a semiconductor substrate. The method includes depositing a capacitor material over the dielectric layer overlying the resistor area and the capacitor area of the semiconductor substrate. The method also includes patterning a mask overlying the capacitor material to selectively define masked regions of the capacitor material overlying the resistor area and the capacitor areas and to define unmasked regions of the capacitor material. In the method, the unmasked regions of the capacitor material are removed. The method forms a resistor structure from the capacitor material in the resistor area.

In accordance with another embodiment, an integrated circuit is provided. The integrated circuit includes a semiconductor substrate with a resistor area and a capacitor area. The integrated circuit also includes a metal-insulator-metal (MIM) capacitor formed in the capacitor area from a first MIM conductive layer, a MIM insulator layer, and a second MIM conductive layer. Further, the integrated circuit includes a resistor structure formed from the first MIM conductive layer in the resistor area.

BRIEF DESCRIPTION OF THE DRAWINGS

Embodiments of integrated circuits having resistor structures formed from capacitor material and methods for fabricating such integrated circuits will hereinafter be described in conjunction with the following drawing figures, wherein like numerals denote like elements, and wherein.

DETAILED DESCRIPTION

The following detailed description is merely exemplary in nature and is not intended to limit the integrated circuits or methods for fabricating integrated circuits as claimed herein. Furthermore, there is no intention to be bound by any expressed or implied theory presented in the preceding technical field, background or brief summary, or in the following detailed description.

In accordance with various embodiments herein, integrated circuits having resistor structures formed from capacitor material and methods for fabricating such integrated circuits are provided. As disclosed herein, problems with conventionally formed resistors may be avoided. Specifically, the methods described herein form metal resistors without requiring any additional masking processing. Further, the metal resistors provide for highly precise resistance as required by analog precision resistors.

The figures illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
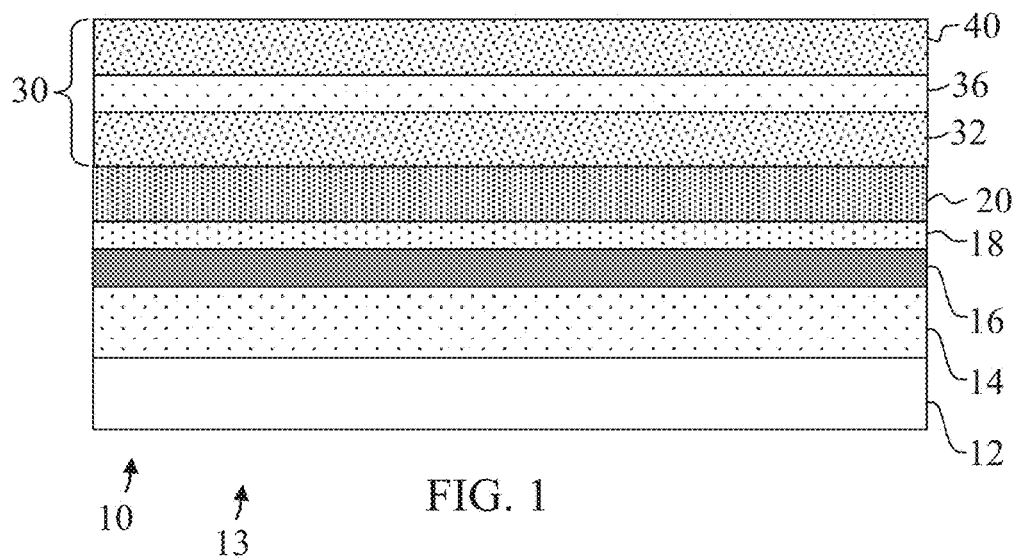
FIGS. 1-6 illustrate, in cross section, a capacitor area of an integrated circuit and method steps for fabricating an integrated circuit with a capacitor in accordance with embodiments herein.

FIGS. 1-6 illustrate the formation of a capacitor in an integrated circuit. In FIG. 1, in an exemplary embodiment, the process of fabricating an integrated circuit 10 includes providing a semiconductor substrate 12. Semiconductor devices are formed in and/or on the semiconductor substrate 12 during typical front-end-of-line (FEOL) processing. Also, back-end-of-line (BEOL) processing may be performed to form contacts, insulating layers, metal layers, and bonding sites on semiconductor substrate 12. The exemplary semiconductor substrate 12 includes a capacitor area 13 and a resistor area (shown in FIGS. 7-15). In FIG. 1, an interlayer dielectric material 14 is deposited over the semiconductor substrate 12. As is well-known, a metal interconnect layer 16 is deposited over the interlayer dielectric material 14 and is planarized. Typically, the metal interconnect layer 16 is copper, though other metals may be used for selected characteristics. After the metal interconnect layer 16 is planarized, in an exemplary embodiment, dielectric layers 18, 20, such as a silicon nitride layer 18 and a silicon oxide layer 20, are deposited over the partially fabricated integrated circuit 10. Either of these layers 18, 20 may be optional. In FIG. 1, an optional metal layer may be deposited over dielectric layer 20. An exemplary metal layer is about 20 nm to about 150 nm thick, such as about 40 nm thick. In an exemplary embodiment, the metal layer is aluminum and is deposited by physical vapor deposition. After deposition of the optional metal layer, a MIM capacitor structure 30 is formed.

In the exemplary embodiment of FIG. 1, the optional metal layer is not utilized. Thus, formation of the MIM capacitor structure 30 includes deposition of a first MIM capacitor material 32, such as a MIM conductive layer, onto the dielectric layer 20. The inclusion of the optional metal layer below the first MIM conductive layer 32 would provide for reduced resistance at the first MIM conductive layer 32. Conductive layers appropriate for use in a MIM capacitor are well known, but an exemplary MIM conductive layer 32 includes titanium nitride (TiN), titanium, tungsten, tungsten silicide, tantalum, aluminum, or other suitable materials or combinations thereof. An exemplary MIM conductive layer 32 has a thickness of about 20 nm to about 50 nm, such as about 35 nm.

A MIM insulator layer 36 is deposited over the first MIM conductive layer 32. Various dielectric materials may be selected for use as the MIM insulator layer 36. An exemplary MIM insulator layer 36 is tantalum oxide ($Ta_2O_5$) or other high-k dielectric material. An exemplary MIM insulator layer 36 has a thickness of about 5 nm to about 20 nm, such as about 12 nm. As shown, a second MIM capacitor material 40, such as a MIM conductive layer, is deposited onto the upper surface 38 of the MIM insulator layer 36. In an exemplary embodiment, the second MIM conductive layer 40 is the same material as the first MIM conductive layer 32. An exemplary MIM conductive layer 40 has a thickness of about 30 nm to about 100 nm, such as about 55 nm.

Figure 2:
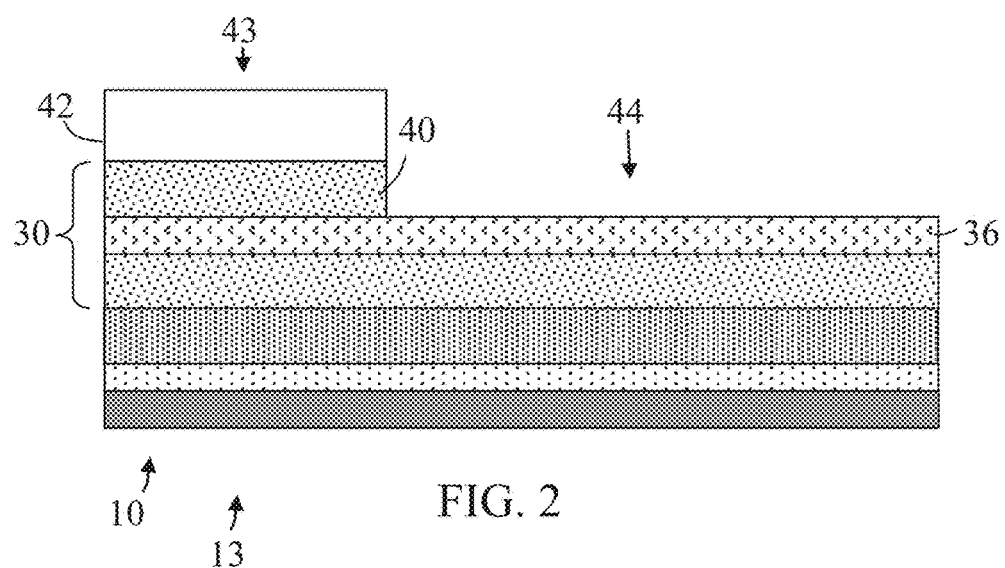

FIGS. 2-6 illustrate further processing to provide for electrical contact through the MIM capacitor structure 30. It is noted that layers 12 and 14 are not shown in FIGS. 2-6 simply for purposes of economy. In FIG. 2, a mask 42 is deposited over the second MIM capacitor material 40 and is patterned according to conventional methods to define a masked region 43 and an unmasked region 44 in the capacitor area 13. After patterning the mask 42, the second MIM conductive layer 40 is etched from the unmasked region 44 through a typical lithographic process. Mask 42 may then be removed.

Figure 3:
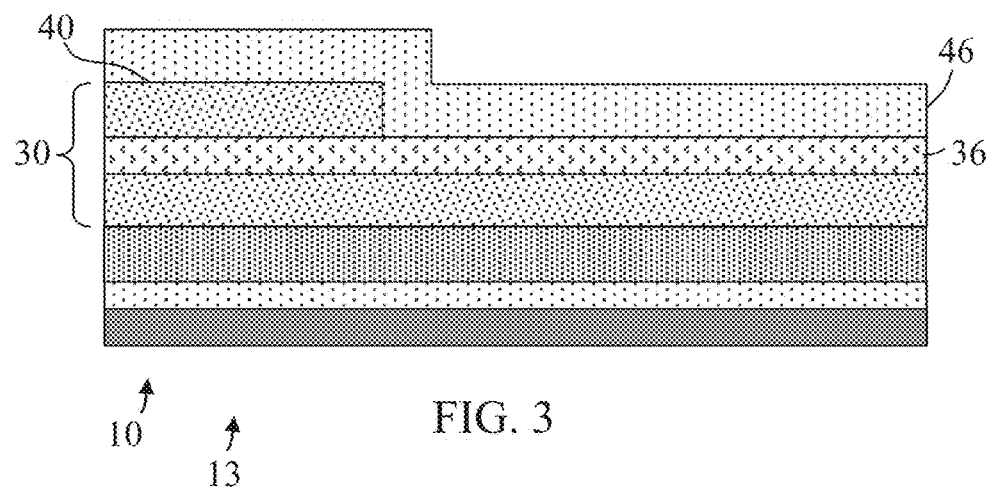
Figure 4:
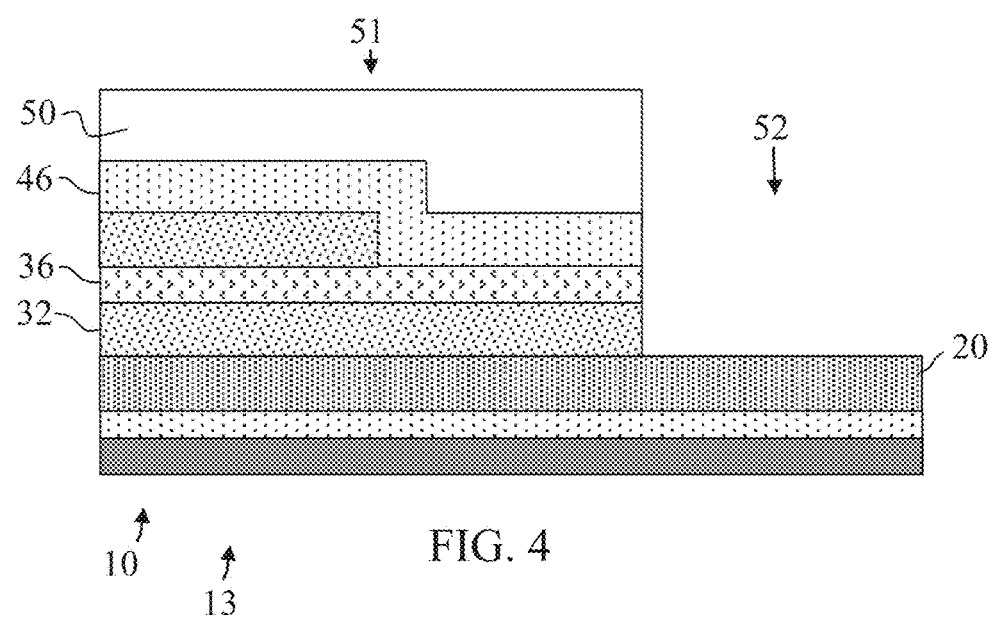

In FIG. 3, a dielectric layer 46, such as silicon nitride, is deposited over the partially fabricated integrated circuit 10. As shown, the dielectric layer 46 contacts the second MIM conductive layer 40 and the MIM insulator layer 36. FIG. 4 illustrates the partially fabricated integrated circuit 10 after deposition and patterning of a mask 50. As shown, the mask 50 defines a masked region 51 and an unmasked region 52 in the capacitor area 13. The first MIM conductive layer 32 in the unmasked region 52 is etched. Specifically, the dielectric layer 46, MIM insulator layer 36, and first MIM conductive layer 32 are removed using mask 50 in a typical lithography process or processes.

Figure 5:
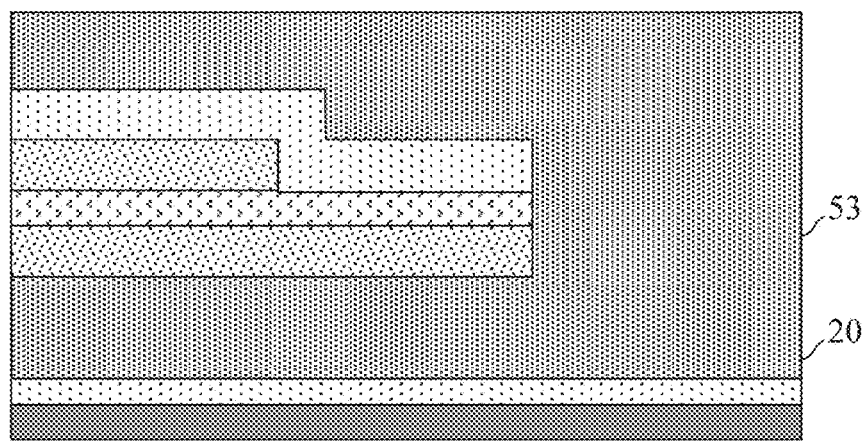

In FIG. 5, additional dielectric material 53 is deposited over the partially fabricated integrated circuit 10. The additional dielectric material 53 may be the same material as the dielectric layer 20, and may be considered to merge with dielectric layer 20. An exemplary dielectric material 53 is silicon oxide.

Figure 6:
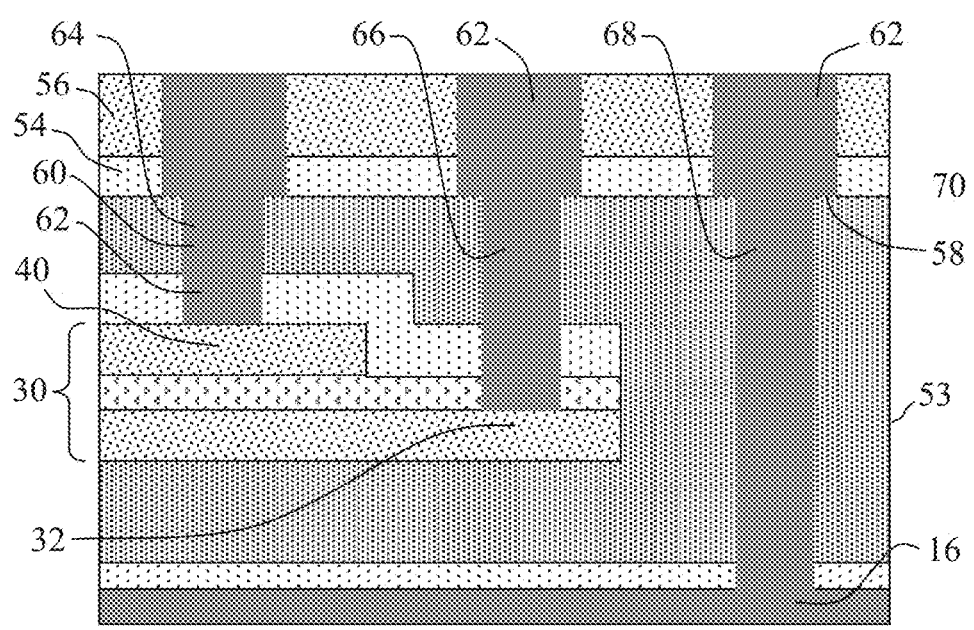

In FIG. 6, additional dielectric layers 54 and 56 are deposited over the dielectric material 53. For example, dielectric layer 54 may be silicon nitride and dielectric layer 56 may be silicon oxide. As shown, via portions 58 are etched to a first depth through layers 54 and 56 to contact the dielectric material 53, and via portions 60 are etched deeper to selected depths. The via portions 58 and 60 are filled with a conductive material 62, such as copper, to form electrical contacts. As shown, a first via 64 extends to and forms an electrical contact with the second MIM conductive layer 40. A second via 66 extends to and forms an electrical contact with the first MIM conductive layer 32. Also, a third via 68 extends to and forms an electrical contact with metal interconnect layer 16. The via portions 60 may be etched and filled with conductive material 62 before depositing layers 54 and 56. In such an embodiment, layers 54 and 56 are then deposited and etched to form via portions 58. Via portions 58 are then filled with conductive material 62 to form the vias 64, 66, and 68.

While the integrated circuit 10 includes three illustrated electrical connections, it is understood that the MIM capacitor structure 30 may be realized with various electrical connections through selected lithography and deposition techniques. Further back-end-of-line (BEOL) processing may be performed to prepare the integrated circuit 10 for its desired use.

Further, while FIGS. 1-6 illustrate an exemplary sequencing of steps, other sequences are contemplated. For example, mask 42 may be deposited and patterned over the first MIM conductive layer 32, and exposed regions of the first MIM conductive layer 32 may be etched before the MIM insulator layer 36 and second MIM capacitor material 40 are deposited. In such embodiments, the mask 50 is then deposited and patterned over the second MIM capacitor material 40 before the MIM insulator layer 36 and second MIM conductive layer 40 are removed using mask 50 in a typical lithography process or processes.

Figure 7:
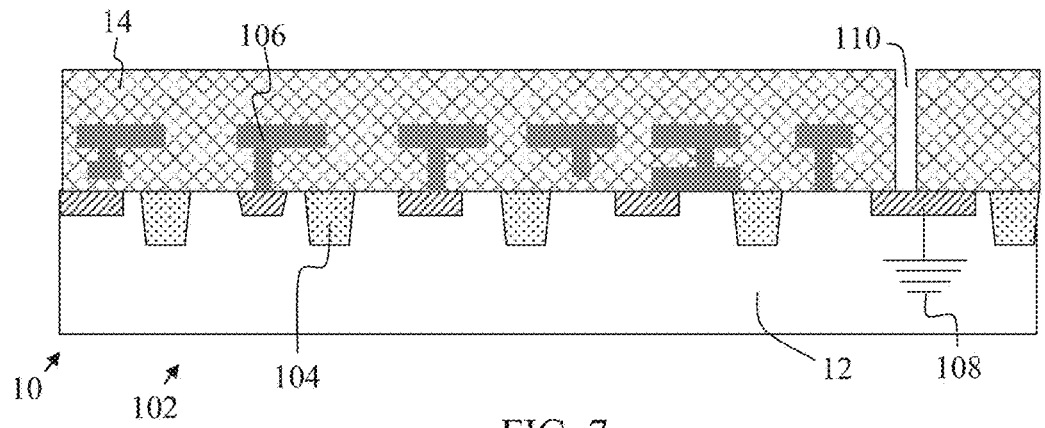
FIGS. 7-13 illustrate, in cross section, a resistor area of the integrated circuit of FIGS. 1-6 and method steps for fabricating an integrated circuit with a resistor structure in accordance with embodiments herein.

As described in relation to FIGS. 1-6, an integrated circuit is fabricated with a MIM capacitor in a capacitor area. FIGS. 7-13 disclose the simultaneous formation of a resistor structure in a resistor area 102 of the semiconductor substrate 12 using masks 42 and/or 50. As shown in FIG. 7, isolation regions 104, such as shallow trench isolation regions, are formed in the semiconductor substrate 12 in accordance with conventional methods. Further, semiconductor devices 106 are formed overlying the semiconductor substrate 12 and a ground 108 is formed in the semiconductor substrate 12 according to known processes.

As disclosed in relation to FIG. 1, the interlayer dielectric material 14 is deposited over the semiconductor substrate 12, including over the resistor area 102. In the exemplary embodiment of FIG. 7, a trench 110 is formed in the interlayer dielectric material 14. Trench 110 may be formed using a conventional masking and lithography process.

Figure 8:
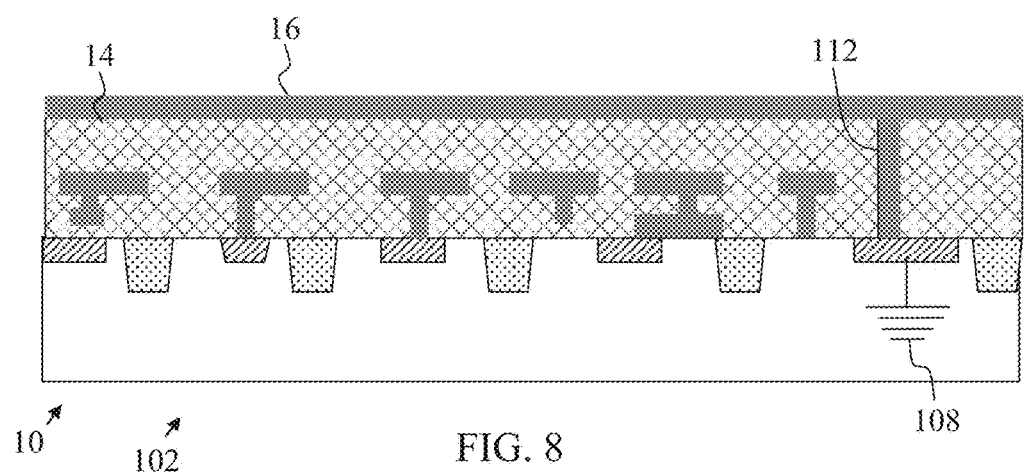

In FIG. 8, the metal interconnect layer 16 is deposited over the semiconductor substrate 12, including over the resistor area 102. Specifically, the metal interconnect layer 16 is deposited over the interlayer dielectric material 14. As shown, the metal interconnect layer 16 fills trench 110 and forms a conductive via 112 in electrical connection with the ground 108.

Figure 9:
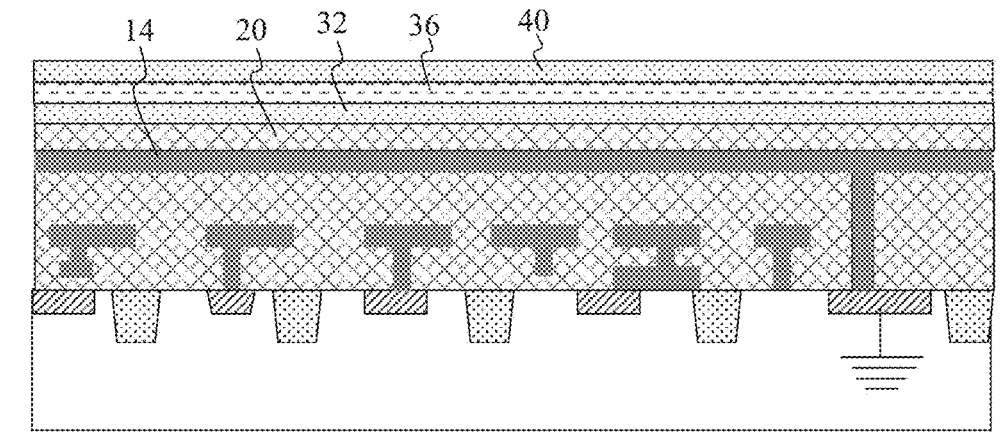

FIG. 9 illustrates the partially fabricated integrated circuit 10 after the layers of the MIM capacitor have been deposited. Specifically, the dielectric layers 18 and/or 20 (with only layer 20 being illustrated) are deposited over the metal interconnect layer 14 in the resistor area 102. Further, the first MIM capacitor material 32 is deposited over the dielectric layer 20, the MIM insulator layer 36 is deposited over the first MIM conductive layer 32, and the second MIM capacitor material 40 is deposited over the MIM insulator layer 36.

Figure 10:
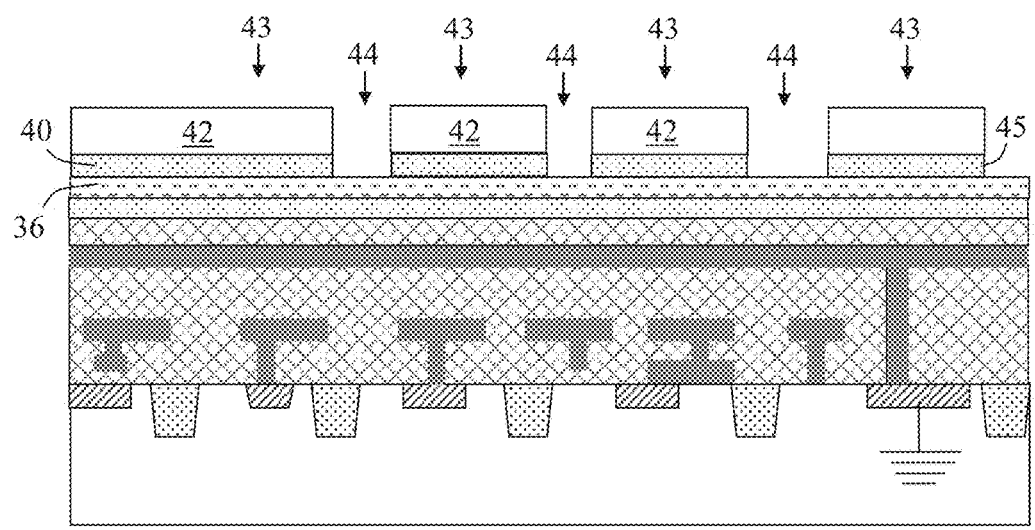

As shown in FIG. 10, the mask 42 is deposited over the resistor area 102 and is patterned to cover masked regions 43 and to expose unmasked areas 44 in the resistor area 102. Further, the second MIM capacitor material 40 is etched to remove the second MIM capacitor material 40 from the unmasked areas 44 and to expose the underlying MIM insulation layer 36. As a result, resistor segments 45 are formed from the second MIM capacitor material 40. As shown, the length of each resistor segment 45 is selectively controlled by the length of the overlying mask 42. As a result, resistance of a particular resistor segment may be controlled by selecting the length of the resistor segment during mask patterning.

Figure 11:
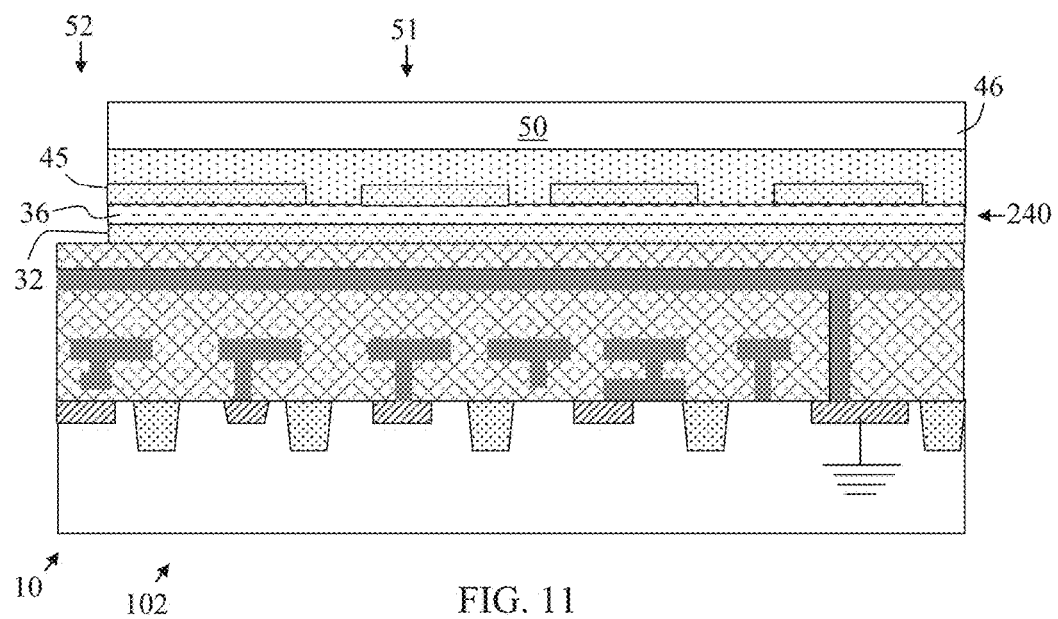

In FIG. 11, the dielectric layer 46 is deposited over the resistor segments 45 before the mask 50 is deposited and patterned over the resistor area 102. The mask covers masked region 51 and exposes unmasked area 52. Thereafter, the process described above for etching the dielectric layer 46, the first MIM capacitor material 32, and the dielectric layer 20 in the capacitor area 13 also etches the dielectric layer 46, the first MIM capacitor material 32, and the dielectric layer 20 in the resistor area 102. As a result, a resistor structure 240 is formed from the first MIM capacitor material 32 and the resistor segments 45. Mask 50 may then be removed.

Figure 12:
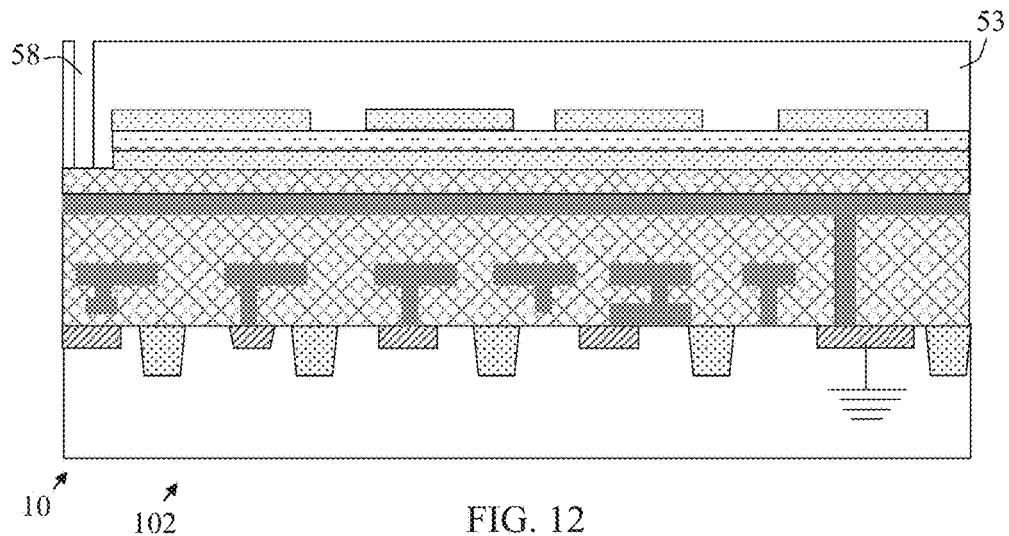
Figure 13:
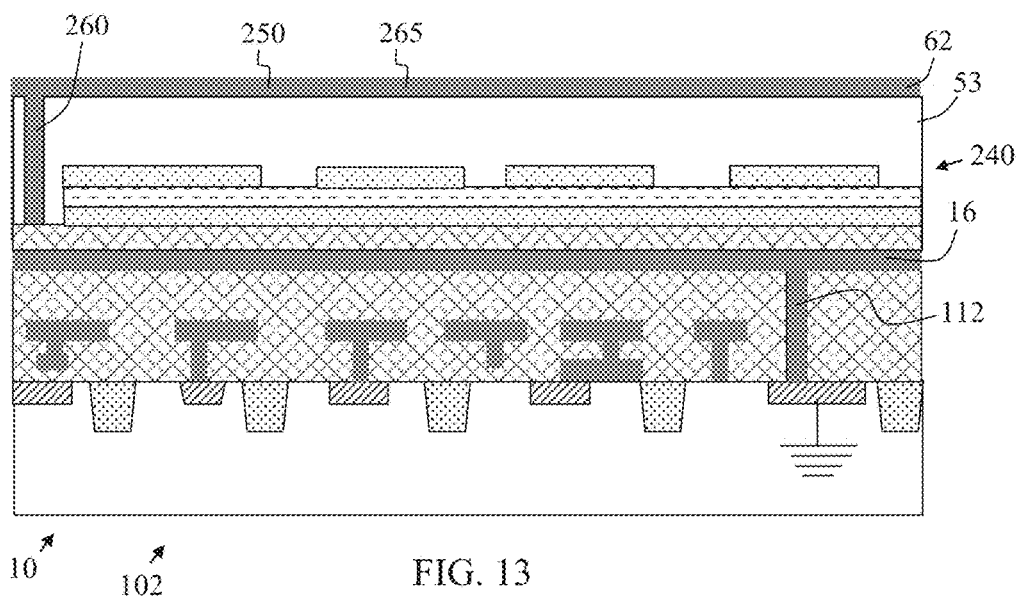

The additional dielectric material 53 is then deposited over the partially fabricated integrated circuit 10 in FIG. 12. While not expressly shown, additional dielectric layers 54 and 56 may also be deposited over the dielectric material 53. As shown, via portions 58 and 60 are etched into the additional dielectric material 53. In FIG. 13, the conductive material 62 is deposited over the additional dielectric material 53 to form an overlying metal layer 250. The conductive material 62 fills the via portions are filled to form conductive via 260. As shown, the conductive via 260 extends to and forms an electrical contact with the metal interconnect layer 16 that is electrically connected to the ground 108 through the conductive via 112. As a result, the overlying metal layer 250, conductive via 260, and metal interconnect layer 16 form a radio frequency (RF) shield 265 for the resistor structure 240.

Figure 14:
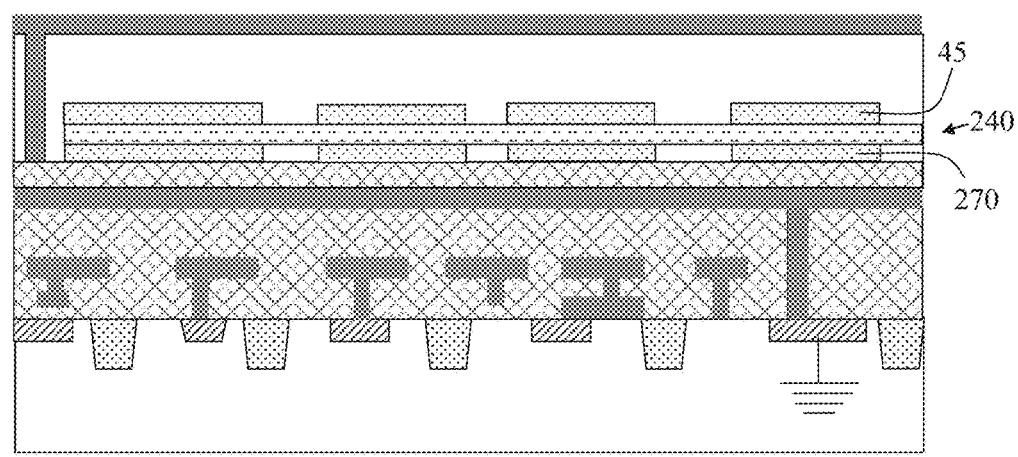
FIGS. 14 and 15 illustrate, in cross section, alternate embodiments of the resistor structure of FIG. 13 and method steps for fabricating an integrated circuit with a resistor structure in accordance with embodiments herein.

FIG. 14 illustrates an alternate embodiment of the resistor structure 240. In FIG. 14, the first MIM capacitor material 32 is etched to form resistor segments 270. For example, in the alternate embodiment for forming the capacitor of FIGS. 1-6 discussed above, the mask 42 is formed and patterned over the first MIM capacitor material 32. After etching the first MIM capacitor material 32 to form the resistor segments 270, the mask 42 is removed, the dielectric layer 46 is deposited, and may be planarized before the MIM insulator layer 36 and second MIM capacitor material 40 are deposited. In such embodiments, the mask 50 is then deposited and patterned over the second MIM capacitor material 40 before portions of the second MIM conductive layer 40 are removed using mask 50 in a typical lithography process or processes to form resistor segments 45.

Figure 15:
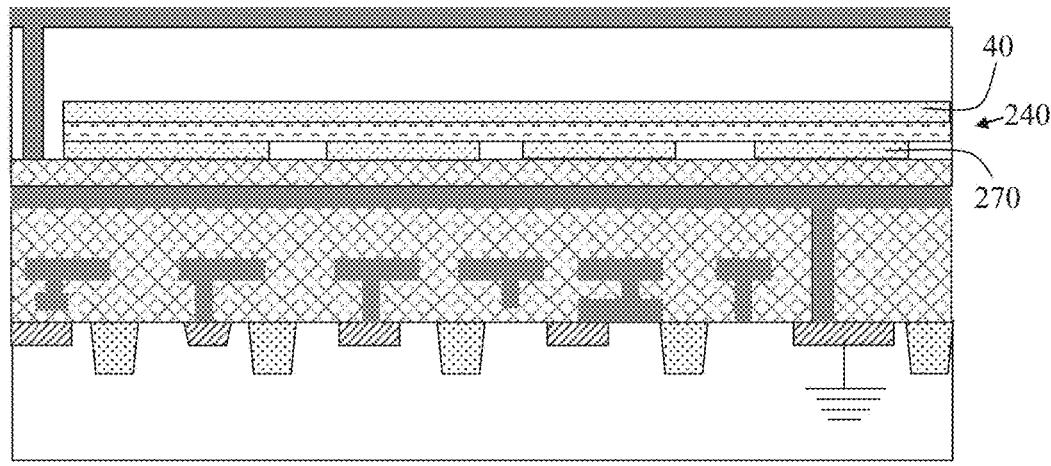

FIG. 15 illustrates another alternate embodiment for forming the resistor structure 240. In FIG. 15, the mask 42 is formed and patterned over the first MIM capacitor material 32 similar to the embodiment of FIG. 14. After etching the first MIM capacitor material 32 to form the resistor segments 270, the mask 42 is removed, the dielectric layer 46 is deposited, and the MIM insulator layer 36 and second MIM capacitor material 40 are deposited. The mask 50 is then deposited and patterned over the second MIM capacitor material 40. However, the second MIM capacitor material 40 is not etched into resistor segments, rather, the length of the second MIM capacitor material 40 may be refined while keeping the second MIM capacitor material 40 in a single uninterrupted layer.

Figure 16:
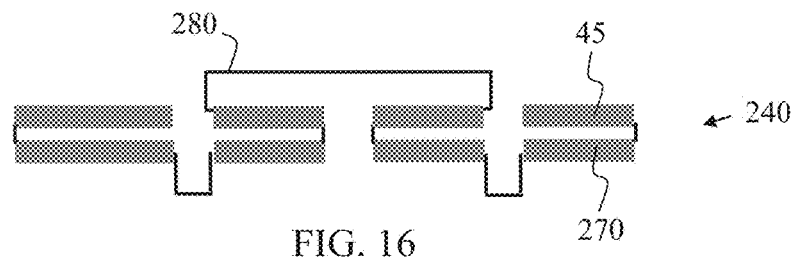
FIGS. 16 and 17 illustrate, in side schematic views, embodiments for providing electrical connections between resistor segments of the resistor structures provided in FIGS. 13-15.
Figure 17:
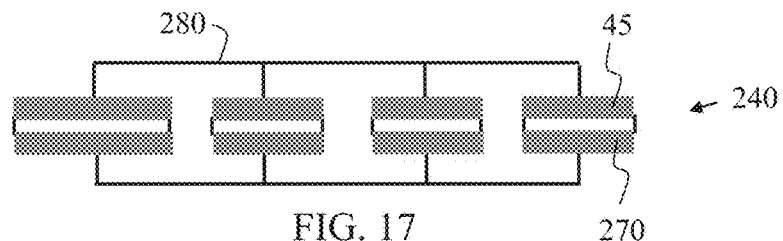

FIGS. 16 and 17 illustrate examples of selective electrical connections between segments 45 and 270 of a resistor structure 240. In FIG. 16, a series connection is provided by electrical connections 280. In FIG. 17, a parallel connection is provided by electrical connections 280. In either case, electrical connections 280 may be formed according to conventional lithography processing.

As shown in FIGS. 16 and 17, resistor structures 240 may be provided with precise resistance as desired by designing resistive pathways through precisely formed resistor segments 45 and/or 270. Simply routing the electrical connections 280 through or around resistor segments of varying selected resistances provides for a wide selection of desired resistances.

Figure 18:
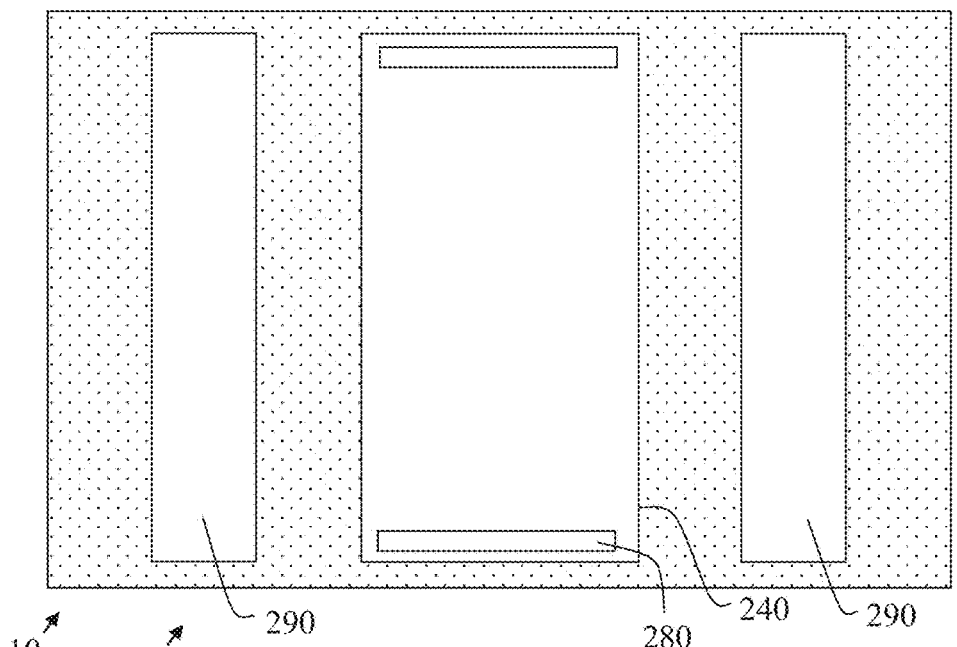
FIG. 18 illustrates, in a plan schematic view, an embodiment of a resistor structure and dummy resistor structures formed in accordance with an embodiment.

FIG. 18 is an overhead schematic view illustrating the formation of a resistor structure 240 with electrical connections 280. As shown, dummy resistor structures 290 are formed adjacent to the resistor structure 240. Such dummy resistor structures 290 are formed in the same manner as resistor structure 240, but are not electrically connected. Thus, the dummy resistor structures 290 may provide improved mismatch. Specifically, the dummy patterns minimize abnormalities from lithography pattern edge defocus and, thus, exhibit better etch line edge roughness and avoid irregularities. As shown, the electrical connections 280 to the resistor structure 240 are provided vertically above or below the resistor structure for efficient use of semiconductor substrate space.

Figure 19:
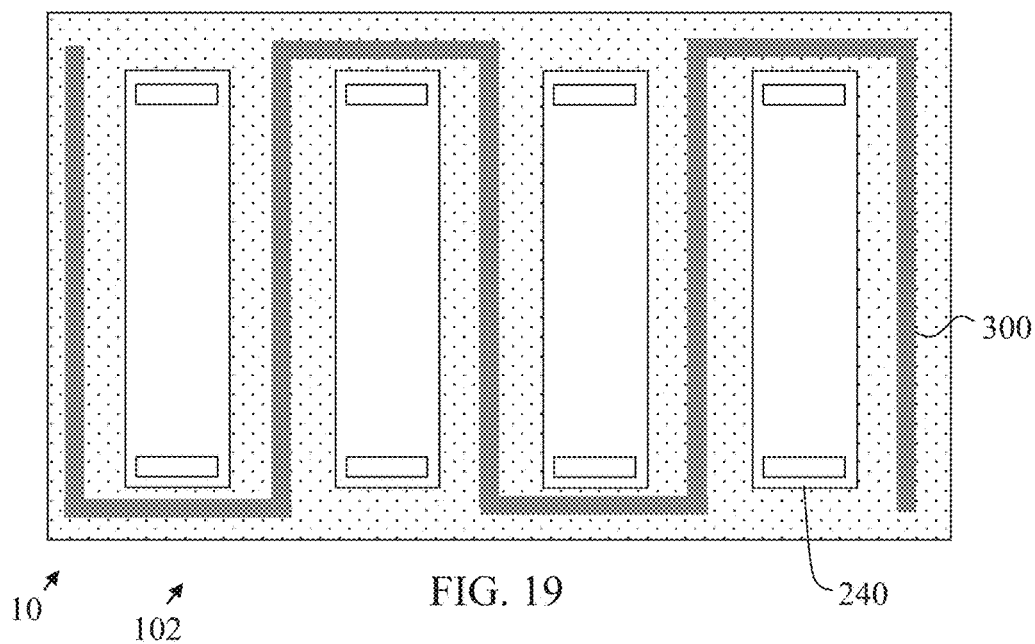
FIG. 19 illustrates, in a plan schematic view, an embodiment of a resistor structure provided with individual resistor shielding formed in accordance with an embodiment.

FIG. 19 is an overhead schematic view illustrating the formation of an RF shield 300 for individual resistor structures 240. As can be envisioned in view of the formation of conductive via 260 described above, trenches may be formed between and around adjacent resistor structures 240. Deposition of the conductive material 62 fills the trenches to form the RF shield 300 shown in FIG. 19.

After formation of the partially fabricated integrated circuit 10 according to methods herein, further processing may be performed to complete the integrated circuit 10. For example, back-end-of-line processing may form further interconnects over the semiconductor substrate 12. By using a capacitor material to form the conductive path of a resistor structure, the process described herein is compatible with MIM capacitor fabrication processes used in advanced process technologies. Consequently, by forming at least one integrated resistor in at least one region of a substrate while concurrently forming at least one MIM capacitor in another region of a substrate, an integrated resistor is formed without requiring additional masks or process steps beyond those required to form the MIM capacitor. Embodiments herein provide integrated circuits with improved resistors that can be fabricated with no additional processing steps. Additionally, because embodiments provide integrated circuits with resistor structures that can have virtually any practical desired effective length and resistance due to the ability to precisely form resistor segments and selectively electrically connect resistor segments, flexibility is provided in the design of integrated circuits, which can lead, for example, to advantageous reductions in device size.

To briefly summarize, the fabrication methods described herein result in integrated circuits with improved resistor performance and resistor fabrication methods with increased flexibility. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a semiconductor substrate with a resistor area and a capacitor area;
   depositing a conductive capacitor material over the resistor area and the capacitor area of the semiconductor substrate;
   forming a resistor structure from the conductive capacitor material in the resistor area;
   forming electrical connections to the resistor structure in the resistor area; and
   forming a resistor shield around the resistor structure in the resistor area, wherein the resistor shield includes a first shield portion and a second shield portion, and wherein the resistor structure is located directly between the first shield portion and the second shield portion.

2. The method of claim 1 wherein forming the resistor shield comprises:
   forming the first shield portion as a metal interconnect layer underlying the resistor structure; and
   forming the second shield portion as a metal layer overlying the resistor structure.

3. The method of claim 1 wherein the resistor structure is formed in a dielectric material over the resistor area, and wherein forming the resistor shield comprises:
   etching a first trench region and a second trench region in the dielectric material, wherein the resistor structure is located between the first trench region and the second trench region; and
   depositing a conductive material in the first trench region to form the first shield portion and in the second trench region to form the second shield portion.

4. The method of claim 1 wherein forming the resistor structure from the conductive capacitor material in the resistor area comprises forming a first resistor structure and a second resistor structure from the conductive capacitor material in the resistor area, and wherein the first shield portion is located between the first resistor structure and the second resistor structure.

5. The method of claim 1 wherein forming the resistor structure from the conductive capacitor material in the resistor area comprises:
   etching the conductive capacitor material to form lower distinct resistor segments;
   depositing an insulator layer over the lower distinct resistor segments; and
   depositing a second conductive capacitor material over the insulator layer, wherein the lower distinct resistor segments and the second conductive capacitor material form the resistor structure in the resistor area.

6. The method of claim 1 wherein forming the resistor structure from the conductive capacitor material in the resistor area comprises:
   depositing an insulator layer over the conductive capacitor material;
   depositing a second conductive capacitor material over the insulator layer; and
   etching the second conductive capacitor material to form upper distinct resistor segments, wherein the upper distinct resistor segments and the conductive capacitor material form the resistor structure in the resistor area.

7. A method for fabricating an integrated circuit, the method comprising:
providing a semiconductor substrate with a resistor area and a capacitor area;
depositing a lower capacitor material over the semiconductor substrate in the resistor area and the capacitor area;
depositing an insulator layer over the lower capacitor material in the resistor area and the capacitor area;
depositing an upper capacitor material over the insulator layer in the resistor area and the capacitor area;
simultaneously etching the upper capacitor material in the resistor area and the capacitor area to form upper distinct resistor segments in the resistor area and to form an upper metal-insulator-metal (MIM) capacitor layer in the capacitor area; and
etching the lower capacitor material in the capacitor area to form a lower MIM capacitor layer in the capacitor area, wherein the upper MIM capacitor layer and the lower MIM capacitor layer form a MIM capacitor and wherein the upper distinct resistor segments form a resistor structure.

8. The method of claim 7 wherein etching the lower capacitor material comprises etching the lower capacitor material in the capacitor area and in the resistor area to form the lower MIM capacitor layer in the capacitor area and to form lower distinct resistor segments in the resistor area, wherein the upper distinct resistor segments and the lower distinct resistor segments form a resistor structure.

9. The method of claim 7 further comprising electrically connecting selected lower distinct resistor segments in series.

10. The method of claim 7 further comprising electrically connecting selected lower distinct resistor segments and selected upper distinct resistor segments in series.

11. The method of claim 7 further comprising electrically connecting selected lower distinct resistor segments and selected upper distinct resistor segments in parallel.

12. The method of claim 7 further comprising depositing a conductive material over the resistor area and the capacitor area, wherein the conductive material forms, in the resistor area, a resistor shield around the resistor structure and forms, in the capacitor area, a first conductive via in electrical contact with the upper MIM capacitor layer and a second conductive via in electrical contact with the lower MIM capacitor layer.

13. The method of claim 7 wherein simultaneously etching the upper capacitor material in the resistor area and the capacitor area comprises:
patterning a mask overlying the upper capacitor material to selectively define masked regions of the upper capacitor material and to define unmasked regions of the upper capacitor material, wherein a length of each masked region of the upper capacitor material in the resistor area is selected; and
removing the unmasked regions of the upper capacitor material to form the upper distinct resistor segments from the masked regions of the upper capacitor material, wherein a resistance of each upper distinct resistor segment is controlled by the selected length of the corresponding masked region; and
wherein the method further comprises forming the resistor structure with a desired resistance from the upper distinct resistor segments by electrically connecting selected upper distinct resistor segments.

14. The method of claim 13 wherein etching the lower capacitor material comprises simultaneously etching the lower capacitor material in the capacitor area and in the resistor area to form the lower MIM capacitor layer in the capacitor area and to form lower distinct resistor segments in the resistor area, wherein the upper distinct resistor segments and the lower distinct resistor segments form a resistor structure.

15. A method for fabricating an integrated circuit, the method comprising:
providing a semiconductor substrate with a resistor area and a capacitor area;
depositing a capacitor material over the resistor area and the capacitor area of the semiconductor substrate;
forming a capacitor structure from the capacitor material in the capacitor area;
forming a resistor structure from the capacitor material in the resistor area; and
depositing a conductive material over the resistor area and the capacitor area to simultaneously form, in the resistor area, a resistor shield around the resistor structure and, in the capacitor area, a conductive via in electrical contact with the capacitor structure.

16. The method of claim 15 wherein forming the capacitor structure from the capacitor material in the capacitor area and forming the resistor structure from the capacitor material in the resistor area comprise simultaneously etching the capacitor material in the capacitor area in the resistor area.

17. The method of claim 15 wherein depositing the capacitor material over the resistor area and the capacitor area of the semiconductor substrate comprises:
depositing a lower capacitor material over the semiconductor substrate in the resistor area and the capacitor area;
depositing an insulator layer over the lower capacitor material in the resistor area and the capacitor area; and
depositing an upper capacitor material over the insulator layer in the resistor area and the capacitor area; and
wherein depositing the conductive material over the resistor area and the capacitor area comprises simultaneously forming, in the capacitor area, a first conductive via in electrical contact with the upper capacitor material and a second conductive via in electrical contact with the lower capacitor material.

* * * * *